(12) United States Patent
Kim et al.

(10) Patent No.: US 7,546,509 B2
(45) Date of Patent: Jun. 9, 2009

(54) METHOD FOR FORMING RATE COMPATIBLE CODE USING HIGH DIMENSIONAL PRODUCT CODES

(75) Inventors: Soo Young Kim, Daejon (KR); Deock-Gil Oh, Daejon (KR); Jae-Moung Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 508 days.

(21) Appl. No.: 10/547,236

(22) PCT Filed: Dec. 30, 2003

(86) PCT No.: PCT/KR03/02919

§ 371 (c)(1),
(2), (4) Date: Aug. 26, 2005

(87) PCT Pub. No.: WO2004/077296

PCT Pub. Date: Sep. 10, 2004

(65) Prior Publication Data

US 2006/0190271 A1 Aug. 24, 2006

(30) Foreign Application Priority Data

Feb. 27, 2003 (KR) .................... 10-2003-0012436

(51) Int. Cl.
*H03M 13/00* (2006.01)
(52) U.S. Cl. .................. 714/755; 714/790; 714/799
(58) Field of Classification Search ........... 714/790, 714/751, 752, 755, 799
See application file for complete search history.

(56) References Cited

U.S. PATENT DOCUMENTS 4,404,674 A * 9/1983 Rhodes .................. 714/793

(Continued)

FOREIGN PATENT DOCUMENTS

JP 61029947 2/1986
JP 63185125 7/1988

(Continued)

OTHER PUBLICATIONS

"Rate Compatible Punctured Turbo Coding foe W-CDMA," Kim et al, Wireless Systems Laboratory, School of Electrical and Computer Engineering, Georgia Institute of Technology, ICPWC'2000, pp. 143-147, ©2001 IEEE.

(Continued)

*Primary Examiner*—Esaw T Abraham
(74) *Attorney, Agent, or Firm*—Ladas & Parry LLP (57) ABSTRACT

The rate compatible code is formed by forming an m dimensional product code by using a systematic block code in a predetermined number of axes: The m dimensional product code is divided into an information block and $2^m-1$ parity blocks. Indices are allocated to the divided blocks of the information block and $2^m-1$ parity blocks. Combinations of the information block and corresponding parity blocks adjacent to the information block are obtained. A first weighting factor $w_1$ for the combinations is estimated and saved. Another parity block adjacent to the saved combination is found and a new combination is formed. The first weighting factor $w_1$ for the new combination is estimated. If there are combinations having the same first weighting factor $w_1$, a second weighting factor $w_2$ for the combinations is estimated and the combinations having a smaller value of $w_2$ are neglected. Rate compatible having the combinations are formed.

20 Claims, 5 Drawing Sheets

U.S. PATENT DOCUMENTS

| | | | |
|---|---|---|---|
| 5,944,850 A | 8/1999 | Chouly et al. | |
| 6,038,696 A * | 3/2000 | Chouly et al. | 714/786 |
| 6,308,294 B1 | 10/2001 | Ghosh et al. | |
| 6,370,669 B1 | 4/2002 | Eroz et al. | |
| 6,430,722 B1 | 8/2002 | Eroz et al. | |
| 6,543,021 B1 * | 4/2003 | Piret | 714/752 |
| 6,606,718 B1 * | 8/2003 | Bessios | 714/701 |
| 6,628,723 B1 * | 9/2003 | Gerlach et al. | 375/259 |
| 6,718,508 B2 * | 4/2004 | Lodge et al. | 714/780 |
| 6,892,342 B2 * | 5/2005 | Eroz et al. | 714/755 |
| 7,027,782 B2 * | 4/2006 | Moon et al. | 455/102 |
| 7,093,179 B2 * | 8/2006 | Shea | 714/755 |
| 7,095,792 B2 * | 8/2006 | Doetsch et al. | 375/265 |
| 7,281,197 B2 * | 10/2007 | Li | 714/790 |
| 7,356,752 B2 * | 4/2008 | Hewitt et al. | 714/755 |
| 2003/0126551 A1 * | 7/2003 | Mantha et al. | 714/790 |
| 2004/0098659 A1 * | 5/2004 | Bjerke et al. | 714/776 |
| 2004/0123222 A1 * | 6/2004 | Widmer | 714/779 |

FOREIGN PATENT DOCUMENTS

| | | |
|---|---|---|
| JP | 02260823 | 10/1990 |
| JP | 04120631 | 4/1992 |
| JP | 07288477 | 10/1995 |
| JP | 10135850 | 5/1998 |
| JP | 2001-134455 A | 5/2001 |
| JP | 2001-136077 A | 5/2001 |
| KR | 2000-0031694 A | 6/2000 |
| KR | 2002-0065788 A | 8/2002 |

OTHER PUBLICATIONS

"Rate Compatible Punctured SCCC," Kim et al, Wireless Systems Laboratory, School of Electrical and Computer Engineering, Georgia Institute of Technology, pp. 2399-2403, ©2001 IEEE.

"Hybrid ARQ using Serial Concatenated Convolutional Codes over Fading Channels," Chandran et al, Lane Department of Computer Science and Electrical Engineering, West Virginia University, VTC'01, pp. 1410-1414, ©2001 IEEE.

"On the Performance of Hybrid FEC/ARQ Systems Using Rate Compatible Punctued Turbo (RCPT) Codes," Rowitch et al, IEEE Transactions on Communications, vol. 48, No. 6, Jun. 2000, pp. 948-959, ©2000 IEEE.

"Adaptive type II hybrid ARQ scheme using zigzag code," Chan et al, Electronics Letters, vol. 35, No. 24, Nov. 25, 1999, pp. 2102-2104.

"An Efficient Type-II Hybrid-ARQ Protocol using Punctured R-S Codes for Wireless ATM Networks," Verikoukis et al, Signal Theory and Communications Department, Universitat Politecnica de Catalunya, VTC'99, pp. 1725-1729, © 1999 IEEE.

"Hybrid-ARQ Scheme Using Different TCM for Retransmission," Yu et al, IEEE Transactions of Communications, vol. 48, No. 10, Oct. 2000, pp. 1609-1613, ©IEEE.

International Search Report mailed Jan. 28, 2004: PCT/KR2003/002919.

* cited by examiner

METHOD FOR FORMING RATE COMPATIBLE CODE USING HIGH DIMENSIONAL PRODUCT CODES

TECHNICAL FIELD

The present invention relates to a method for forming a rate compatible code using high dimensional product codes and a computer-readable recording medium for recording a program that implements the method. The rate compatible code can provide various coding rates and coding performances by using product codes higher than two dimensions.

BACKGROUND ART

Rate compatible codes can provide various coding rates and coding performances with a single encoder and decoder by applying various punctured patterns to parities added to correct errors in an error correction code. Because of this advantage, the rate compatible codes have been applied to adaptive coding and hybrid automatic repeat request (ARQ) in a time varying channel environment.

The rate compatible codes are formed by applying an optimal punctured pattern to convolutional codes or turbo codes based on convolutional codes. U.S. Pat. No. 6,430,722 and Korean Patent Laid-Open No. 2001-052246 disclose rate compatible coding methods applied to turbo codes based on convolutional codes. They suggest methods for generating codes with various coding rates by puncturing bits with an optimal punctured pattern.

The method has been applied to convolutional codes and used in adaptive coding schemes for various channel conditions in wireless communications. For the fourth-generation mobile communication systems, hybrid ARQ schemes using rate compatible turbo codes are described in the literatures below, which are incorporated herein by reference.

(1) Douglas N. Rowitch and Laurence B. Milstein, "On the Performance of Hybrid FEC/ARQ Systems Using Rate Compatible Punctured Turbo (RCPT) Codes," *IEEE Transactions on Communications*, Vol. 48, No. 6, June 2000, pp. 948-959

(2) Hasung Kim and Gordon L. Stuber, "Rate Compatible Punctured Turbo Coding for W-CDMA," *ICPWC*2000, pp. 143-147

(3) Hasung Kim and Gordon L. Stuber, "Rate Compatible Punctured SCCC," *VTC* 2001 *Fall*, Vol. 4, pp. 2399-2403

(4) Naveen Chandran and Mathew C. Valenti, "Hybrid ARQ Using Serial Concatenated Convolutional Codes over Fading Channels," *VTC* 2001 *Spring*, 6-9 May 2001 Rhodes, Greece, Vol. 2, pp. 1410-1414

(5) Jean X. Yu, Yuan Li, Hidekazu Murata, and Susumu Yoshida, "Hybrid-ARQ Scheme Using Different TCM for Retransmission," *IEEE Transactions on Communications*, Vol. 48, No. 10, October 2000, pp. 1609-1613

As the references show, although the rate compatible codes can be applied to various areas, no prior art suggests rate compatible codes using block codes. This is because, in block codes, rate compatible codes cannot be formed by using various punctured patterns in convolutional codes. If they are formed in the same method as convolutional codes, performance is seriously degraded. This is disclosed by Tingfang Ji and Wayne E. Stark, "Rate Compatible Product Codes," *Proceedings of MILCOM* 2000, Vol. 1, pp. 412-416."

There have been a few examples of rate compatible codes using block codes, which is somewhat different from that using convolutional codes, and this is shown in the following literatures. A paper "Rate Compatible Product Codes" published by Tingfang Ji and Wayne E. Stark in Proceedings of MILCOM 2000, Vol. 1, pp. 412-416 discloses rate compatible codes using four-dimensional product codes.

The product codes used in the paper, however, are not product codes in a strict sense. They simply generate distinct parities for each interleaving. For example, they generate a code word or a parity for the information interleaved in rows if the block codes codes are one-dimensional. They additionally generate a code word or a parity for the information interleaved in columns, if the product codes are two-dimensional. Again, They additionally generate a code word or a parity for the information interleaved in diagonal_directions when the product codes are three/four-dimensional.

In a transmission unit, various coding rates are generated based on how many of the four parities are transmitted. In a decoding unit, decoding performance is enhanced through repeated decoding processes, because all the parities are formed using the same information word.

In other words, if the original code is considered as the code with all parities generated in four interleaving methods, then various coding rates cannot be generated by puncturing a part of the original code. This method, however, has a disadvantage that the performance cannot be increased by increasing the dimension.

This implies that the performance of the original code with all parities can be even worse than the punctured code with a part of the parity in a random error channel.

This is because the above mentioned code could not use the unique property of the product code, explained in the following)

The product code is serial concatenation of block codes with a block interleaver within them. Therefore, there are parities on parities (checks on checks), and the check digits on check digits are the same whether the checks on rows or on columns are computed first.

In addition, there have been a few schemes generating various coding rates using block codes, although they are not rate compatible codes in the following references 6 and 7. However, they have problems that they only generate limited number of coding rates, that they may produce unacceptable performance with a single code or they cannot be decoded with a single code.

(6) K. S. Chan, Li Ping and S. Chan, "Adaptive type II hybrid ARQ scheme using zigzag code," *Electronics Letters*, 25 Nov. 1999, Vol. 35, No. 24, pp. 2102-2104

(7) Ch. V. Verikoukis and J. J. Olmos, "An Efficient Type II Hybrid ARQ Protocol Using Punctured R-S Codes for Wireless ATM Networks," VTC99 Fall, Vol. 3, 1725-1729

Besides, Korean patent application No. 2001-56774 discloses an Iterative Decoding Method for Block Turbo Codes of Greater than Three Dimensions.

DISCLOSURE OF INVENTION

It is, therefore, an object of the present invention to provide a method for forming a rate compatible code that can provide various coding rates by using m-dimensional product codes, m being more than two, and a computer-readable recording medium for recording a program that implements the method. The product codes are divided by an information block and several parity blocks, and a punctured pattern is determined according to each parity block.

In accordance with one aspect of the present invention, there is provided a method for forming a rate compatible code using high dimensional product codes, including the steps of: a) forming an m dimensional product. code by using a systematic block code in a predetermined number of axes, wherein the m is a positive integer number; b) dividing the m dimensional product code into an information block and $2^m-1$ parity blocks; c) allocating indices to the divided blocks of the information block and $2^m-1$ parity blocks; d) obtaining combinations of the information block and corresponding parity blocks which are adjacent to the information block; e) estimating a first weighting factor $w_1$ for the combinations; f) finding combinations having the same first weighting factor $w_1$ as identical combinations; h) if there is no combinations having the same first weighting factor $w_1$, forming rate compatible codes by using the combinations; and g) if there is combinations having the same first weighting factor $w_1$, obtaining second combinations of the combinations and parity blocks adjacent to the combinations and forming rate compatible codes by using the second combinations.

The method includes the steps of: g-1) estimating a second weighting factor of $w_2$ for the identical combinations; g-2) selecting a third combination having largest weighting factor $w_2$ among the identical combinations; and g-3) obtaining second combinations of the combinations excepting identical combinations and corresponding new parity blocks which is adjacent to the combination and obtaining second combinations of the third combination and corresponding new parity blocks adjacent to the third combination.

In accordance with one aspect of the present invention, there is provided a computer-readable recording medium for recording a program that implements a method for forming a rate compatible code using high dimensional product codes, the method comprising the steps of: a) forming an m dimensional product code by using a systematic block code in a predetermined number of axes, wherein the m is a positive integer number; b) dividing the m dimensional product code into an information block and $2^m-1$ parity blocks; c) allocating indices to the divided blocks of the information block and $2^m-1$ parity blocks; d) obtaining combinations of the information block and corresponding parity blocks which are adjacent to the information block; e) estimating a first weighting factor $w_1$ for the combinations; f) finding combinations having the same first weighting factor w identical combinations; h) if there is no combinations having the same first weighting factor $w_1$, forming rate compatible codes by using the combinations; and g) if there is combinations having the same first weighting factor $w_1$, obtaining second combinations of the combinations and parity blocks adjacent to the combinations and forming rate compatible codes by using the second combinations.

The computer readable record medium includes the steps of: g-1) estimating a second weighting factor of $w_2$ for the identical combinations; g-2) selecting a third combination having largest weighting factor $w_2$ among the identical combinations; and g-3) obtaining second combinations of the combinations excepting identical combinations and corresponding new parity blocks which is adjacent to the combination and obtaining second combinations of the third combination and corresponding new parity blocks adjacent to the third combination.

BRIEF DESCRIPTION OF DRAWINGS

The above and other objects and features of the present invention will become apparent from the following description of the preferred embodiments given in conjunction with the accompanying drawings, in which.

BEST MODE FOR CARRYING OUT THE INVENTION

Other objects and aspects of the invention will become apparent from the following description of the embodiments with reference to the accompanying drawings, which is set forth hereinafter.

Figure 1:
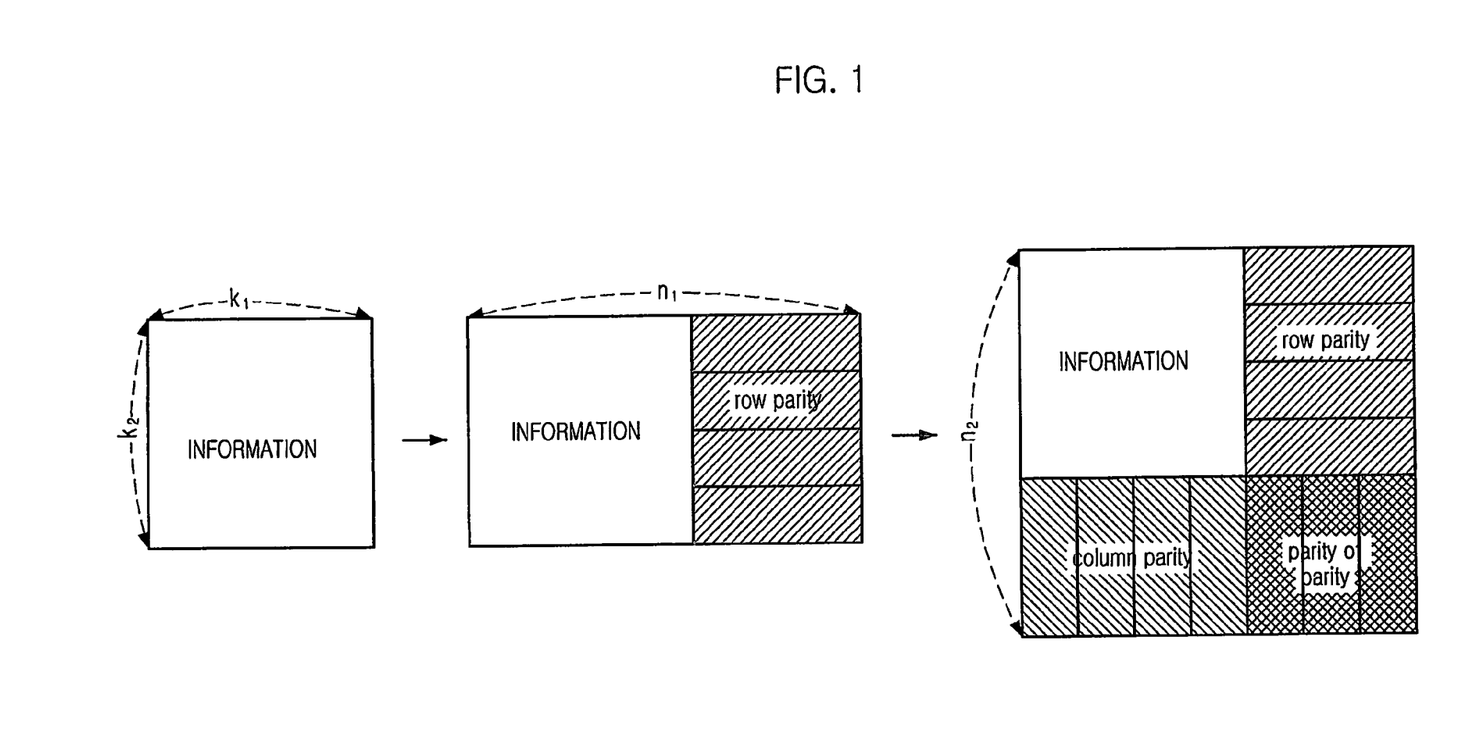
FIG. 1 shows the procedure for constructing classical 2 dimensional (2D) product codes using an $(n_1,k_1)$ block code and an $(n_2,k_2)$ block code in accordance with a preferred embodiment of the present invention.
Figure 2:
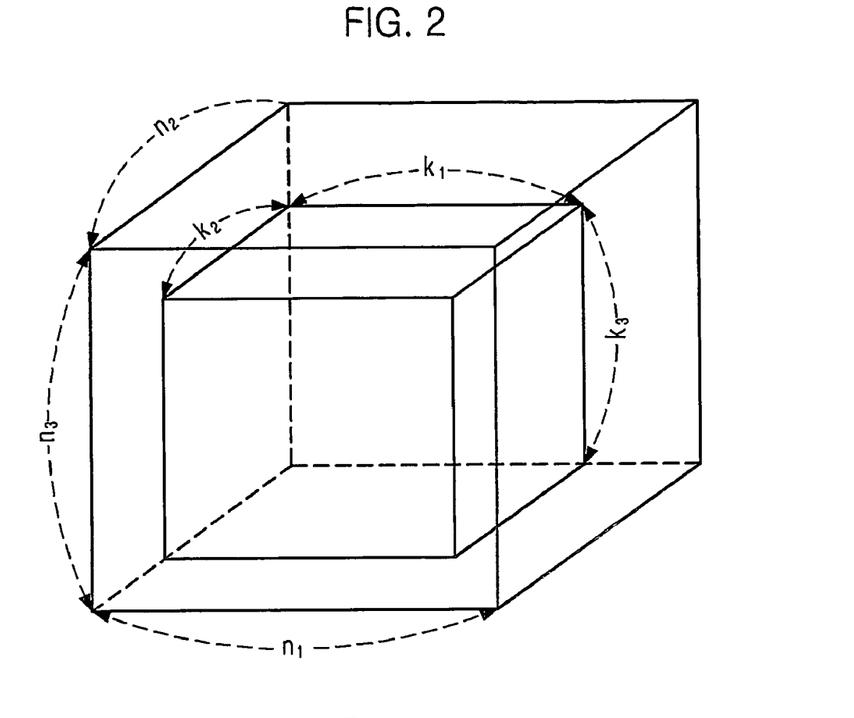
FIG. 2 shows the configuration of a 3D product code constructed in accordance with a preferred embodiment of the present invention.

FIG. 1 shows the procedure for constructing classical 2 dimensional (2D) product codes using an $(n_1,k_1)$ block code and an $(n_2,k_2)$ block code in accordance with a preferred embodiment of the present invention, and FIG. 2 shows the configuration of a 3D product code constructed exactly the same way as in FIG. 1.

Referring to FIGS. 1 and 2, m dimensional product codes are theoretically possible for m larger than 2, and there are $(n_1 \times n_2 \times \ldots n_m)$ bits (symbols) of encoded block in the m dimensional product codes. Increasing the dimension of the product codes, which is an extension of making 2-dimensional product codes from linear block codes, results in an increase in the minimum distance of the product code. Therefore, the decoding performance can be improved but at the expense of the code rate and the data frame length. In addition, the degree of freedom can be increased in choosing the component codes in each axis, and this make it possible to generate RC codes with various code rates and coding gains.

Figure 3A:
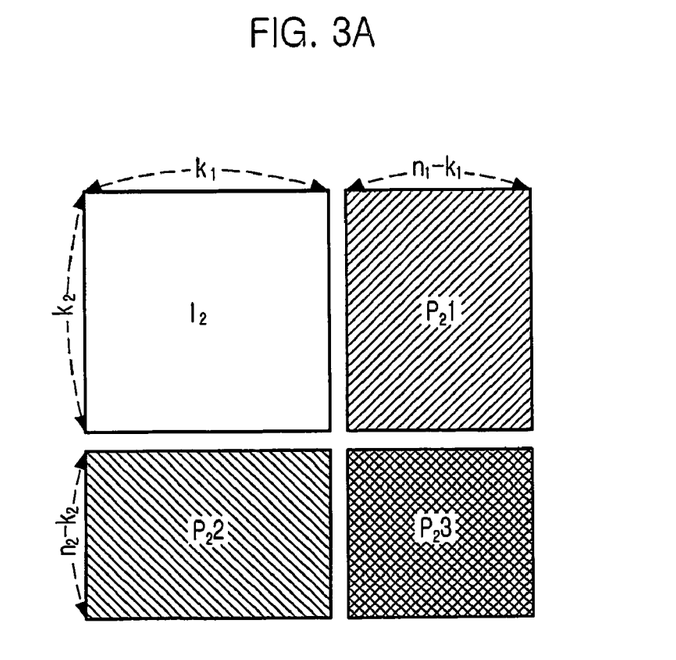
FIGS. 3A and 3B show procedures of dividing m dimensional product code into several m dimensional blocks in accordance with a preferred embodiment of the present invention.
Figure 3B:
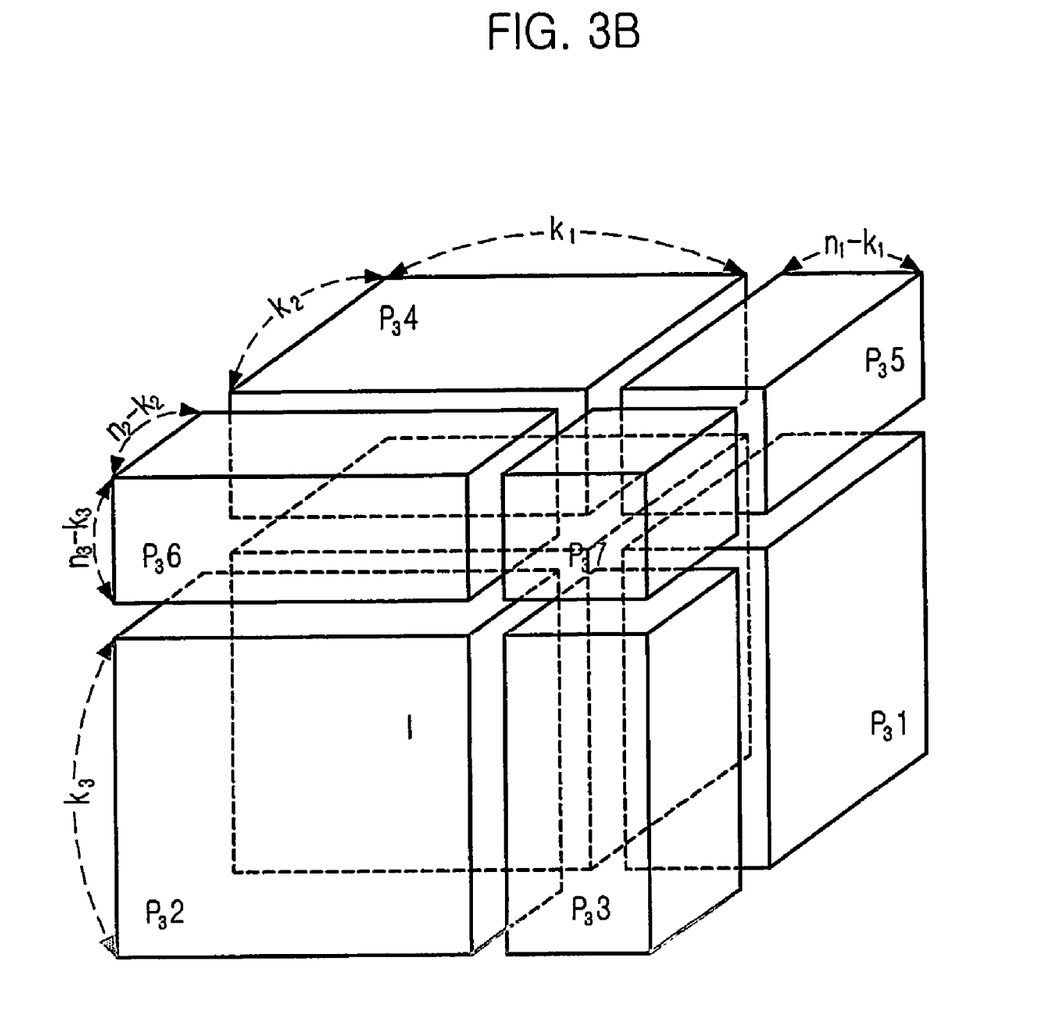

In an m dimensional product code, it is divided into several consisting m dimensional blocks of which axes lengths are information length of k or parity length of (n–k). For example, in the 2D product code of FIG. 1, there are four 2D blocks including an information block of $I_2$ and three parity blocks of $P_2 1$ to $P_2 3$ as shown in FIG. 3A. Similarly, the 3D product code of FIG. 2 consists of eight 3D blocks including an information block of $I_3$ and 7 parity blocks of $P_3 1$ to $P_3 7$ as shown in FIG. 3B. Generalizing this, it is shown that an m dimensional product code consists of an information block and $2^m-1$ parity blocks. This is because the number of existing m dimensional blocks is exactly the same as the number of ways of allocating two different lengths of k and (n–k) at each axis of m dimensional blocks.

Now, RC codes can be made by making several combinations of these consisting blocks. In other words, RC codes are formed by puncturing a part of parity blocks.

To make the problem easy, each m dimensional block consisting the m dimensional product code is identified with a binary number, $(b_1, b_2, \ldots, b_m)$ using the following rule. 0 is assigned at $b_i$ if the length of the i-th axis in the block is $k_i$, and 1 at $b_i$ if the length is $(n_i-k_i)$. For example each block can be represented in the 2D product code of FIG. 3 as follows: $I_2=(0,0)$, $P_2 1=(1,0)$, $P_2 2=(0,1)$, $P_2 3=(1,1)$. Similarly, each block in the 3D product code of FIG. 3 can be represented as follows $I_3=(0,0,0)$, $P_3 1=(1,0,0)$, $P_3 2=(0,1,0)$, $P_3 3=(1,1,0)$, $P_3 4=(0,0,1)$, $P_3 5=(1,0,1)$, $P_3 6=(0,1,1)$, $P_3 7=(1,1,1)$. By investigating the above binary representation rule, the information block is always represented by all zeros.

RC codes are formed with various combinations of these blocks, and a certain combinations of blocks are selected, which can be a (punctured) code. To make a code, the information block and more than one parity block are required, wherein more than the one parity blocks are adjacent to the information block. In addition, all blocks in a given combination must be adjacent each other. If two blocks are adjacent in the m dimensional product code, then (m−1) positions of their binary representation should be in agreement. By using this, combinations of blocks forming a code can be found. For example, in the 3D product code of FIG. 3, the block combination of ($I_3$, $P_3\mathbf{1}$, $P_3\mathbf{2}$) is a punctured code but that of ($I_3$, $P_3\mathbf{5}$, $P_3\mathbf{6}$) is not.

In order to form a compact RC code, two weighting factors of $w_1$ and $w_2$ are defined, and block combinations are selected with larger values of weighting factors. $w_1$ is defined by the number of adjacencies in a given block combinations. For example, in the 2D product code of FIG. 3, there are four adjacencies of $I_2$ & $P_2\mathbf{1}$, $I_2$ & $P_2\mathbf{2}$, $P_2\mathbf{1}$ & $P_2\mathbf{3}$, and $P_2\mathbf{2}$ & $P_2\mathbf{3}$. If there are block combinations of the same value of $w_1$, $w_2$ is used, wherein $w_2$ is defined by the amount of adjacencies as:

$$w_2 = \sum_{i=1}^{w_1} A_i \quad \text{Eq. 1}$$

where $A_i$ is the amount of each adjacency, and it is the length for a 2D code and the area for a 3D code.

These weighting factors represent error correcting capability of the block combination. This is because in the iterative decoder, the magnitudes of the weighting factors are directly related to the amount of extrinsic information flow. In summary, RC block turbo codes is formed by using the following procedure in FIG. 4.

Figure 4:
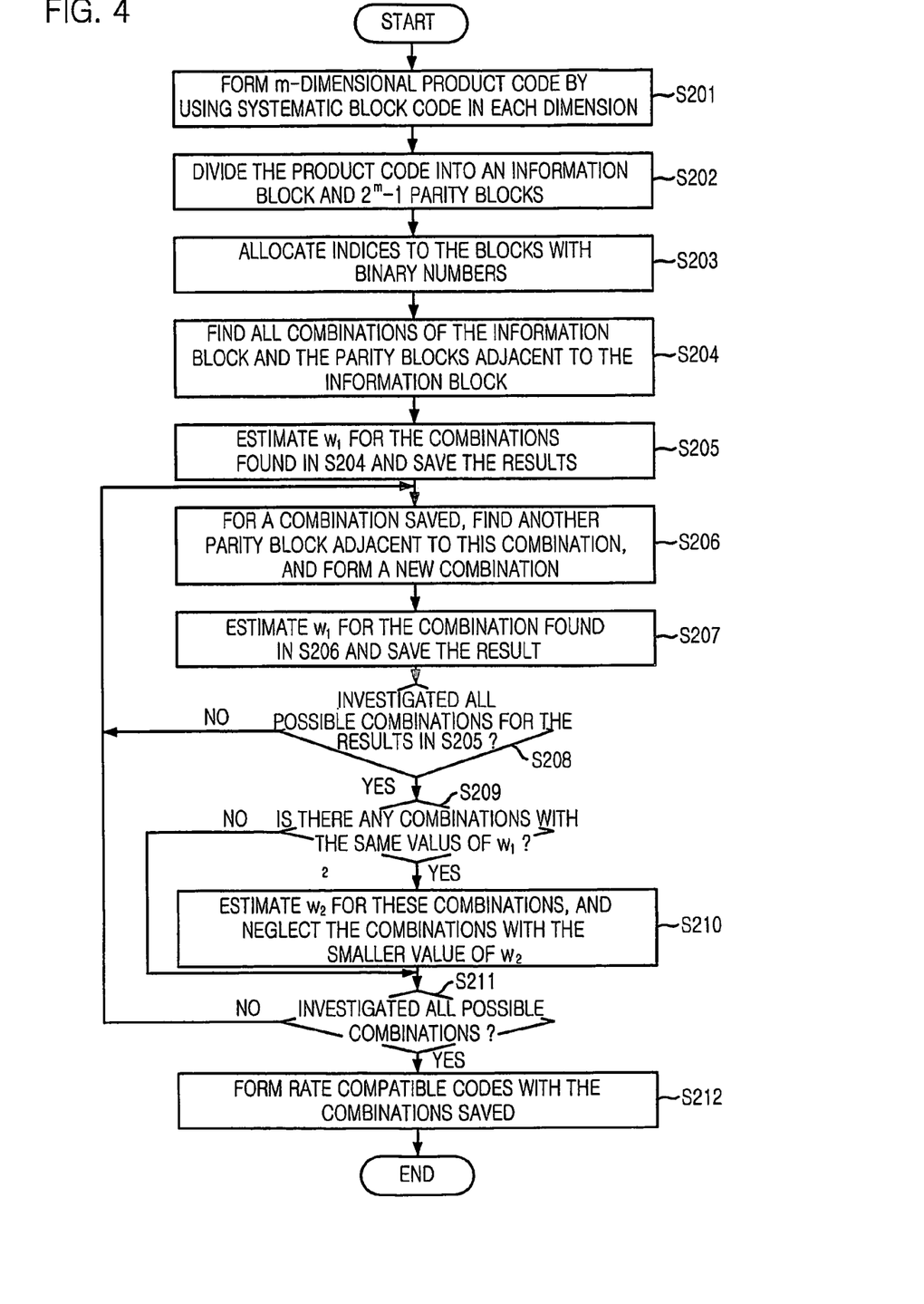
FIG. 4 is a flowchart describing the method for forming a rate compatible code using high dimensional product codes in accordance with the embodiment of the present invention.

FIG. 4 is a flowchart describing the method for forming a rate compatible code using high dimensional product codes in accordance with the embodiment of the present invention. Referring to FIG. 4, to form rate compatible codes using high-dimensional product codes, at step S201, an m-dimensional product code is formed by using a systematic block code in each dimension.

At step S202, the m dimensional product code is divided into an information block and $2^m−1$ parity blocks. At step S203, the identifier (index) of each block, divided in the step S202, is expressed in a binary number.

At step S204, all combinations of the information block and parity blocks which are adjacent to the information block are found. The indices of the parity blocks in these combination must includes m−1 zeros.

At step S205, for the combinations found in the step S204, the number of adjacencies, $w_1$ is estimated and the results are saved. At step S206, for a combination saved in the step 205, another parity block which is adjacent to this combination is found and a new combination is formed. If two blocks are adjacent in the m dimensional product code, then (m−1) positions of their binary representation should be in agreement.

At step S207, $w_1$ is estimated for the combination found in the step S 206, and the result is saved. At step S208, whether all possible combinations for the results in the step S205 were investigated is checked. If all possible combinations were not checked, then return to the step S206. If all possible combinations were checked, then at step S 209 whether there is any combinations with the same value of $w_1$ is checked. If there are combinations with the same value of $w_1$, then at step 210 estimate $w_2$ which is defined by the amount of adjacencies as:

$$w_2 = \sum_{i=1}^{w_1} A_i \quad \text{Eq. 2}$$

where $A_i$ is the amount of each adjacency, and it is the length for a 2D code and the area for a 3D code. The combinations with smaller values of $w_2$ are neglected. At step 211, whether all possible combinations in the m dimensional product were investigated is checked. If all possible combinations were not investigated, then return to the step S206.

The above described process is applied to the two-dimensional product code of FIG. 3A. First, there are two block adjacent to the information block, which are a $P_2\mathbf{1}$ block and a $P_2\mathbf{2}$ block. With the $P_2\mathbf{1}$ block, following combinations can be formed.

(1) $I_2+P_2\mathbf{1}$
(2) $I_2+P_2\mathbf{1}+P_2\mathbf{2}$
(3) $I_2+P_2\mathbf{1}+P_2\mathbf{3}$
(4) $I_2+P_2\mathbf{1}+P_2\mathbf{3}+P_2\mathbf{3}$ The above four combinations satisfy the code forming conditions. Therefore, the four combinations are all saved.

Subsequently, combinations that can be formed by using the P2 block are shown as follows.

(5) $I_2+P_2\mathbf{2}$
(6) $I_2+P_2\mathbf{2}+P_2\mathbf{1}$: dismissed as saved in combination (2)
(7) $I_2+P_2\mathbf{2}+P_2\mathbf{3}$
(8) $I_2+P_2\mathbf{2}+P_2\mathbf{1}+P_2\mathbf{3}$: dismissed as saved in combination (4)

Accordingly, combinations that can be formed by using the two-dimensional product code are six. For these six combinations, weighting factors of $w_1$ and $w_2$ are estimated to make rate compatible codes.

As more specific example, the process of FIG. 4 is applied to a three-dimensional product code.

In Table 1, all the block combinations with which can be used as iterative decoder are selected. Two 3D product code is used. For examples, one with the same component code in each axis and the other with different component codes is used. The 3D code A in Table 1 is the product code of the (16,11) extended BCH codes, while the 3D code B is the product code of the (32,26), (16,11), and (8,4) extended BCH codes. Since the same component code in each axis in the 3D code A is used, there are 8 combinations in total. While the 3D code B have 18 variations. Weighting factors $w_1$ and $w_2$ are estimated for each punctured code, and they are shown in Table 1 with code rate, R. In Table 1, Code 1 to Code 3 can be seen as parallel-concatenated 2D block turbo codes, Code 4 to Code 6 can be seen as serially concatenated 2D block turbo codes, and rest of the codes (Code 7 to Code 18) can be seen as punctured codes from serially concatenated 3D block turbo codes. Therefore it is required to estimate $w_2$ for Code 1 to Code 6 as the sum of the adjacent lengths, and for Code 7 to Code 18 as the sum of the adjacent areas.

Depending on the values of $w_1$ and $w_2$, an efficient RC codes can be formed. In the 3D code A example, Code 7 shows almost the same BER performance to Code 4-6 even with a higher code rate, although they all use the same number of parity blocks as seen in Table 2. This is because Code 7 has larger value of w, i.e. more adjacencies. It would be shown the same in the case of 3D code B though the BER performance is not demonstrated in this paper. For example, in the case of 3D code B, Code 4-6 shows better BER performance than Code 7. In addition, Code 4 shows the best BER performance among Code 4-6 because it has the largest value of $w_2$. This is applicable to all cases in Table 1.

TABLE 1

| | Block combinations/ number of parity blocks | 3D code A $(16.11) \times (16.11) \times (16.11)$ | | | 3D code B $(32.26) \times (16.11) \times (8.4)$ | | |
|---|---|---|---|---|---|---|---|
| | | R | $w_1$ | $w_2$ | R | $w_1$ | $w_2$ |
| Code 1 | $(I_3, P_31, P_32)/2$ | 0.52 | 2 | 22 | 0.59 | 2 | 37 |
| Code 2 | $(I_3, P_32, P_34)/2$ | | | | 0.41 | | 15 |
| Code 3 | $(I_3, P_31, P_34)/2$ | | | | 0.45 | | 30 |
| Code 4 | $(I_3, P_31, P_32, P_33)/3$ | 0.47 | 4 | 32 | 0.56 | 4 | 47 |
| Code 5 | $(I_3, P_32, P_34, P_36)/3$ | | | | 0.34 | | 23 |
| Code 6 | $(I_3, P_34, P_35)/3$ | | | | 0.41 | | 38 |
| Code 7 | $(I_3, P_31, P_32, P_34)/3$ | 0.42 | 3 | 363 | 0.37 | 3 | 434 |
| Code 8 | $(I_3, P_31-P_34)/4$ | 0.39 | 5 | 473 | 0.36 | 5 | 482 |
| Code 9 | $(I_3, P_31, P_32, P_34, P_35)/4$ | | | | 0.34 | | 544 |
| Code 10 | $(I_3, P_31, P_32, P_34, P_36)/4$ | | | | 0.32 | | 668 |
| Code 11 | $(I_3, P_31, P_32, P_34-P_36)/5$ | 0.36 | 7 | 583 | 0.30 | 7 | 778 |
| Code 12 | $(I_3, P_31-P_35)/5$ | | | | 0.33 | | 592 |
| Code 13 | $(I_3, P_31-P_34, P_36)/5$ | | | | 0.31 | | 716 |
| Code 14 | $(I_3, P_31, P_32, P_34-P_37)/6$ | 0.35 | 9 | 633 | 0.29 | 9 | 822 |
| Code 15 | $(I_3, P_31-P_35, P_37)/6$ | | | | 0.32 | | 646 |
| Code 16 | $(I_3, P_31-P_34, P_36, P_37)/6$ | | | | 0.30 | | 766 |
| Code 17 | $(I_3, P_31-P_36)/6$ | 0.34 | 9 | 693 | 0.29 | 9 | 826 |
| Code 18 | $(I_3, P_31-P_37)/7$ | 0.32 | 12 | 768 | 0.28 | 12 | 900 |

Table 2 shows an example of RC block turbo codes using the 3D code A, and it shows the code rate variation of each code and the corresponding bit error rate (BER) performance on an AWGN channel using a BPSK modulation scheme. A modified soft output Viterbi algorithm is used in the iterative decoder [S. Kim, W. S. Yang, and H. Lee, "Trellis-Based Decoding of High-Dimensional Block Turbo Codes," ETRI Journal, Vol. 25, No. 1, February 2003, pp. 1-8]. An uncoded BPSK scheme requires about 10 dB of bit energy to noise spectral density ratio ($E_b/N_o$) to achieve a BER of $10^{-6}$. The simulation results of Table 2 shows that the RC block turbo code can produce a coding gain of from 5.0 dB up to 8.5 dB depending on the block combination (or puncturing scheme). It can be made more abundant variations if a different component code in each axis of the product code is used. For example 18 variations in the code rate are possible if the 3D code B in Table 1 is used.

TABLE 2

| | | Code rate | | $E_b/N_o$(dB) @ |
|---|---|---|---|---|
| Code | Block combinations | ratio | dB | BER = $10^{-6}$ |
| Code 1 | $(I_3, P_31, P_32)$ | 0.52 | −2.81 | 5.0 |
| Code 4 | $(I_3, P_31, P_32, P_33)$ | 0.47 | −3.25 | 4.0 |
| Code 7 | $(I_3, P_31, P_32, P_34)$ | 0.42 | −3.74 | 4.0 |
| Code 8 | $(I_3, P_31-P_34)$ | 0.39 | −4.10 | 3.0 |
| Code 12 | $(I_3, P_31-P_35)$ | 0.36 | −4.44 | 2.7 |
| Code 14 | $(I_3, P_31, P_32, P_34-P_37)$ | 0.35 | −4.58 | 2.3 |
| Code 17 | $(I_3, P_31-P_36)$ | 0.34 | −4.75 | 2.2 |
| Code 18 | $(I_3, P_31-P_37)$ | 0.32 | −4.88 | 1.5 |

Figure 5:
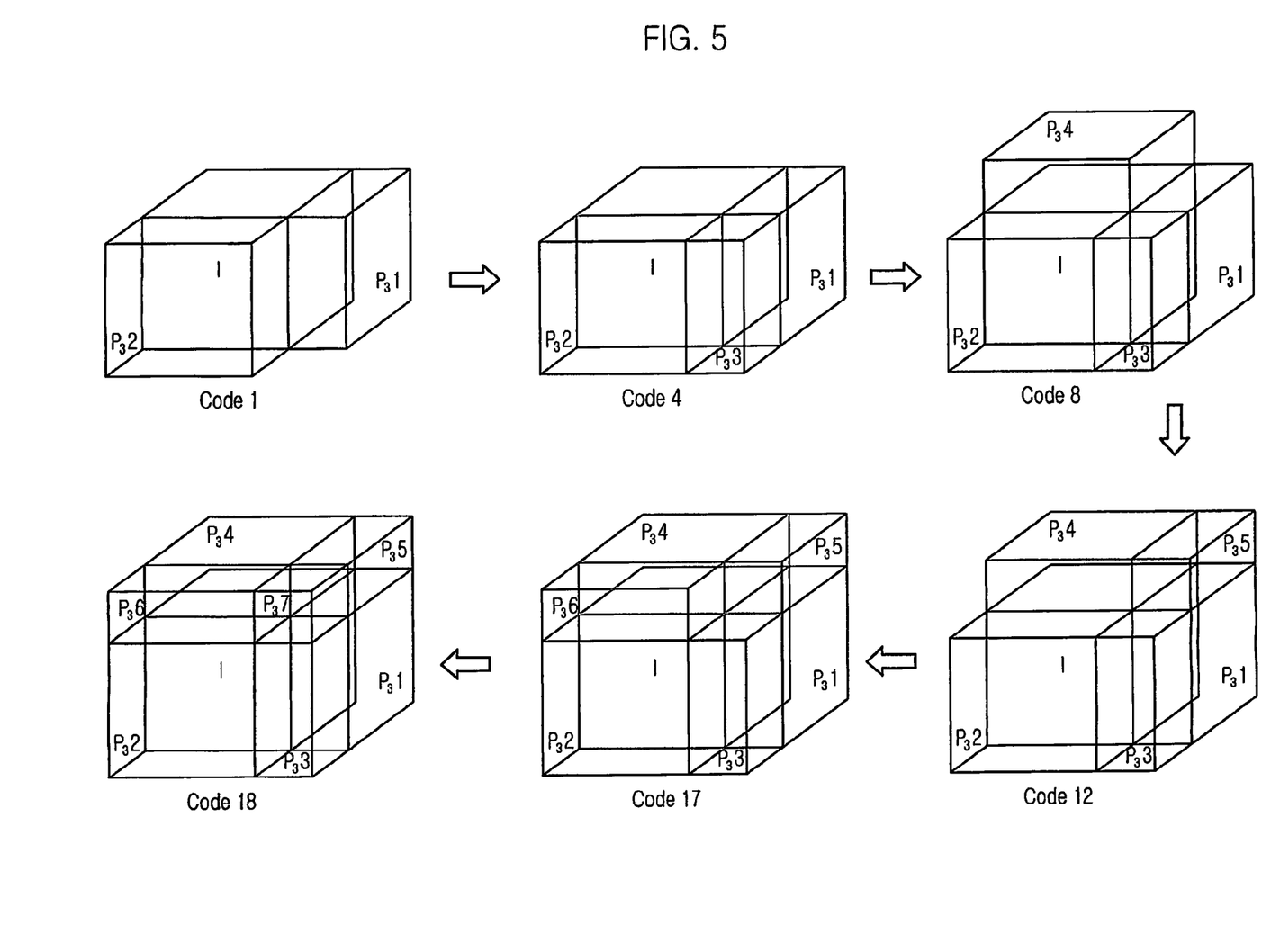
FIG. 5 shows a procedure of forming RC codes in accordance with a preferred embodiment of the present invention.

The RC product codes can be applied to a hybrid ARQ scheme. Table 3 illustrates the hybrid ARQ type II and III schemes with the RC product codes in Table 2. For example, in type-II scheme, The Code 1 consisting of $(I_3, P_31, P_32)$ is transmitted at the first transmission. If the first transmission fails, the $P_33$ blocks are sent at the second transmission. If this fails again, $P_34$, $P_35$, $P_36$, and $P_37$ are transmitted at the successive transmissions. In type-III scheme, Code 4, Code 8, Code 12, Code 17 and Code 18 are sent at every retransmission in order after sending the Code 1 at the first transmission. FIG. 5 illustrates this.

TABLE 3

| Retransmission number | Type-II | Type-III |
|---|---|---|
| 1 | $(I_3, P_31, P_32)$ | $(I_3, P_31, P_32)$ (Code 1) |
| 2 | $P_33$ | $(I_3, P_31-P_33)$ (Code 4) |
| 3 | $P_34$ | $(I_3, P_31-P_34)$ (Code 8) |
| 4 | $P_35$ | $(I_3, P_31-P_35)$ (Code 12) |
| 5 | $P_36$ | $(I_3, P_31-P_36)$ (Code 17) |
| 6 | $P_37$ | $(I_3, P_31-P_37)$ (Code 18) |

The rate compatible code forming method of the present invention can be embodied in the form of a program and stored in a computer-readable recording medium, such as CD-ROMS, RAMs, ROMs, floppy disks, hard disks and magneto-optical disks.

The technology of the present invention can design a rate compatible code effectively by using a product code of a systematic block code, provides an encoding method that has various coding rates and coding performances by using various combinations of the consisting blocks. The technology of the present invention can be applied to various areas.

While the present invention has been described with respect to certain preferred embodiments, it will be apparent to those skilled in the art that various changes and modifications may be made without departing from the scope of the invention as defined in the following claims.

What is claimed is:

1. A method for forming a rate compatible code using high dimensional product codes, comprising the steps of:
 a) receiving a data signal as a systematic block code by a receiver and forming an m dimensional product code by using the systematic block code in a predetermined number of axes, wherein the m is a positive integer number larger than or equal to 2;
 b) dividing the m dimensional product code into an information block and $2^m-1$ parity blocks;
 c) allocating indices to the divided blocks of the information block and $2^m-1$ parity blocks;
 d) obtaining combinations of the information block and corresponding parity blocks which are adjacent to the information block;
 e) estimating and saving a result of first weighting factor $w_1$ for the combinations;
 f) finding another parity block adjacent to the saved combinations and forming new combinations;
 g) estimating and saving the first weighting factor $w_1$ for the new combinations;
 h) if there are combinations with the same value of the first weighting factor $w_1$, estimating a second weighting factor $w_2$ for the combinations and neglecting the combinations having a smaller value of $w_2$ until all possible combinations are investigated; and
 i) forming rate compatible codes having the combinations, wherein the received signal is outputted as a rate compatible code.

2. The method as recited in claim 1, wherein the $w_1$ is defined by a number of adjacencies in a given block combination and $w_2$ is defined by an amount of adjacencies in a given block combination.

3. The method as recited in claim 1, wherein the steps e) to g) are repeatedly performed until all possible combinations are investigated.

4. The method as recited in claim 1, wherein, in the step h), if there is no combinations having the same first weighting factor $w_1$ and all possible combinations are not investigated, go back to step f).

5. The method as recited in claim 1, wherein the m dimensional product code has an information block and parity blocks that are formed in m-dimensional axes.

6. The method as recited in claim 1, wherein the information block of the step b) has axes whose size is the same as the length of an information word of a code that forms the axes of the m dimensional product code.

7. The method as recited in claim 1, wherein the parity block of the step b) has axes whose size is the same as the length of an information word or the length of parity words that form the axes of the m dimensional product code, except the information block.

8. The method as recited in claim 1, wherein the index of a block is assigned as a binary number which is expressed in m bits by assigning '0' when the size of axes that form the block is equal to the size of the information word, and assigning '1' when the size of axes that form the block is equal to the size of a parity word.

9. The method as recited in claim 1, wherein in the step d), it is determined whether indices of the parity block in the combination include m−1 '0'.

10. The method as recited in claim 1, wherein in the step f), it is determined whether indices of the another adjacent parity block in the new combinations have agreement in their binary representation at (m−1) positions.

11. A computer program product embodied on a computer readable recording medium, the computer program product comprising an instruction that, when executed by a processor to perform a method for forming a rate compatible code using high dimensional product codes, comprising the steps of:

a) forming an m dimensional product code by using a systematic block code in a predetermined number of axes, wherein the m is a positive integer number larger than or equal to 2;

b) dividing the m dimensional product code into an information block and $2^m-1$ parity blocks;

c) allocating indices to the divided blocks of the information block and $2^m-1$ parity blocks;

d) obtaining combinations of the information block and corresponding parity blocks which are adjacent to the information block;

e) estimating and saving a result of first weighting factor $w_1$ for the combinations;

f) finding another parity block adjacent to the saved combinations and forming new combinations;

g) estimating and saving the first weighting factor $w_1$ for the new combinations;

h) if there are combinations with the same value of the first weighting factor $w_1$, estimating a second weighting factor $w_2$ for the combinations and neglecting the combinations having a smaller value of $w_2$ until all possible combinations are investigated; and i) forming rate compatible codes having the combinations.

12. The computer program product as recited in claim 11, wherein the $w_1$ is defined by a number of adjacencies in a given block combination and $w_2$ is defined by an amount of adjacencies in a given block combination.

13. The computer program as product recited in claim 11, wherein the steps e) to g) are repeatedly performed until all possible combinations are investigated.

14. The computer program product as recited in claim 11, wherein, in the step h), if there is no combinations having the same first weighting factor $w_1$ and all possible combinations are not investigated, go back to step f).

15. The computer program product as recited in claim 11, wherein the m dimensional product code has an information block and parity blocks that are formed in m-dimensional axes.

16. The computer program product as recited in claim 11, wherein the information block of the step b) has axes whose size is the same as the length of an information word of a code that forms the axes of the m dimensional product code.

17. The computer program product as recited in claim 11, wherein the parity block of the step b) has axes whose size is the same as the length of an information word or the length of parity words that form the axes of the m dimensional product code, except the information block.

18. The computer program product as recited in claim 11, wherein the index of a block is assigned as a binary number which is expressed in m bits by assigning '0' when the size of axes that form the block is equal to the size of the information word, and assigning '1' when the size of axes that form the block is equal to the size of a parity word.

19. The computer program product as recited in claim 11, wherein in the step d), it is determined whether indices of the parity block in the combination include m−1 '0'.

20. The computer program product as recited in claim 11, wherein in the step f), it is determined whether indices of the another adjacent parity block in the new combinations have agreement in their binary representation at (m−1) positions.

* * * * *